United States Patent
Chen et al.

(10) Patent No.: US 6,795,350 B2
(45) Date of Patent: Sep. 21, 2004

(54) CIRCUIT AND METHOD FOR TUNING A REFERENCE BIT LINE LOADING TO A SENSE AMPLIFIER BY OPTIONALLY CUTTING A CAPACITIVE REFERENCE BIT LINE

(75) Inventors: Han-Sung Chen, Hsin-Chu (TW); Kuo-Yu Liao, Hsin-Chu (TW); Chen-Hao Po, Hsin-Chu (TW); Chun-Hsiung Hung, Hsin-Chu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/351,528

(22) Filed: Jan. 27, 2003

(65) Prior Publication Data

US 2004/0008546 A1 Jan. 15, 2004

(30) Foreign Application Priority Data

Jul. 9, 2002 (TW) .......................................... 91115381 A

(51) Int. Cl.[7] ................................................ G11C 7/00
(52) U.S. Cl. ................ 365/189.07; 365/210; 365/185.2
(58) Field of Search ............................ 365/189.07, 205, 365/185.2, 185.21, 210

(56) References Cited

U.S. PATENT DOCUMENTS

| | | | |
|---|---|---|---|
| 5,828,616 A | * 10/1998 | Bauer et al. | ................ 365/210 |
| 6,330,188 B1 | * 12/2001 | Pascucci | ................... 365/185.2 |
| 6,362,661 B1 | * 3/2002 | Park | ........................... 327/53 |
| 6,404,677 B2 | * 6/2002 | Lee | ........................ 365/189.07 |

* cited by examiner

*Primary Examiner*—Huan Hoang
(74) *Attorney, Agent, or Firm*—Rabin & Berdo, P.C.

(57) ABSTRACT

A circuit and method for tuning a reference bit line loading to a sense amplifier that compares the voltage on a sense node with the voltage on a reference data line node to determine a sensing signal on the output of the sense amplifier. The sense node is selectively connected to a memory cell to generate the sensed voltage on the sense node to represent the data stored in the selected memory cell. There is included a reference cell unit and a reference bit line unit connected to the reference data line node. The reference cell unit contains at least one reference cell to provide a reference current to the reference bit line node, and the reference bit line unit contains at least one reference bit line optionally cut to determine the reference bit line loading.

20 Claims, 4 Drawing Sheets

CIRCUIT AND METHOD FOR TUNING A REFERENCE BIT LINE LOADING TO A SENSE AMPLIFIER BY OPTIONALLY CUTTING A CAPACITIVE REFERENCE BIT LINE

FIELD OF THE INVENTION

The present invention relates generally to a sense circuit and method for a nonvolatile memory, and more particularly to a circuit and method for tuning a reference bit line loading to a sense amplifier by optionally cutting a capacitive reference bit line.

BACKGROUND OF THE INVENTION

Nonvolatile memories such as electrically erasable programmable read only memory (EEROM) and flash memory are well known. Each of them includes a memory array consisting of a plurality of memory cells and corresponding peripheral circuitry to select one memory cell from the memory array and read out the electrical signal representative of data stored in the selected memory cell. For read-out of stored data from the selected memory cell, a sense amplifier is used to sense the electrical signal during a predetermined timing and to further determine the logic content of the electrical signal, which is also well known.

Generally, a sense amplifier determines the logic value stored in a selected memory cell by comparing the output of the memory cell with a reference signal provided by a reference cell. In order for a sense amplifier to accurately sense the data stored in the memory cell, the reference cell is designed to have the same structure as that of the memory cell and to be fabricated by the same process as that used to fabricate the memory cell to thereby render the operation of the reference cell as similar as possible to that of the memory cell. Nevertheless, variations between memories from the implementations of them by integrated circuits become more significant to their electrical performance as scaling down of integrated circuits progresses, resulting in possible errors occurring in the adjustment or operation of the memory circuits. Conventionally, wiring simulated to the electrical path of the memory cell is further introduced to be connected to the reference side of the sense amplifier to reduce the variations of the capacitive effect resulting from the wiring for the memory cells in the integrated circuits, in addition to the aforementioned simulation of the reference cell to the memory cell. For example, dummy bit lines or reference bit lines simulated to the memory cell bit lines are proposed to be connected to the reference cell by Eitan et al. in U.S. Pat. No. 6,128,226. However, constant reference bit lines cannot be adaptive to various parasitic effects in applications of even a same integrated circuit. In particular, for a sense circuit applied to memories of different density or capacity, a constant ratio for the voltage sense of the sense circuit is impossible to be maintained due to the loading changes on the reference data line node and, as a result, adjustment is made to each circuit for a better voltage sense scheme. Consequently, tedious work or adjustment procedure for the whole circuit cannot be avoid in different applications of the same circuit scheme, even a same sense circuit is used. Therefore, it is desired a tunable reference bit line loading for voltage sense of a sense amplifier adaptive to memories of various capacity or density.

SUMMARY OF THE INVENTION

One object of the present invention is to propose a circuit and method for tuning the reference bit line loading to a sense amplifier adaptive to the voltage sense of memory arrays of different capacity or density.

In a nonvolatile memory, a sense amplifier compares the voltage on a sense node with the voltage on a reference data line node to determine a sensing signal, of which the sense node is selectively connected to a memory cell to produce a voltage representative of data stored in the memory cell on the sense node. According to the present invention, a circuit and method for tuning a reference bit line loading comprises connecting a reference cell unit and a reference bit line unit to a reference bit line node that is controlled to be connected to the reference data line node, in which the reference cell unit includes at least one reference cell to provide a reference current to the reference bit line node and the reference bit line unit includes at least one reference bit line optionally cut to determine the reference bit line loading. Preferably, the reference cell unit includes a plurality of identical reference cells connected in parallel, each generates a reference bit current, and the reference bit line unit includes a plurality of reference bit lines each having a same capacitance before being cut. The number of the reference cells is preferred equal to the number of the reference bit lines.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
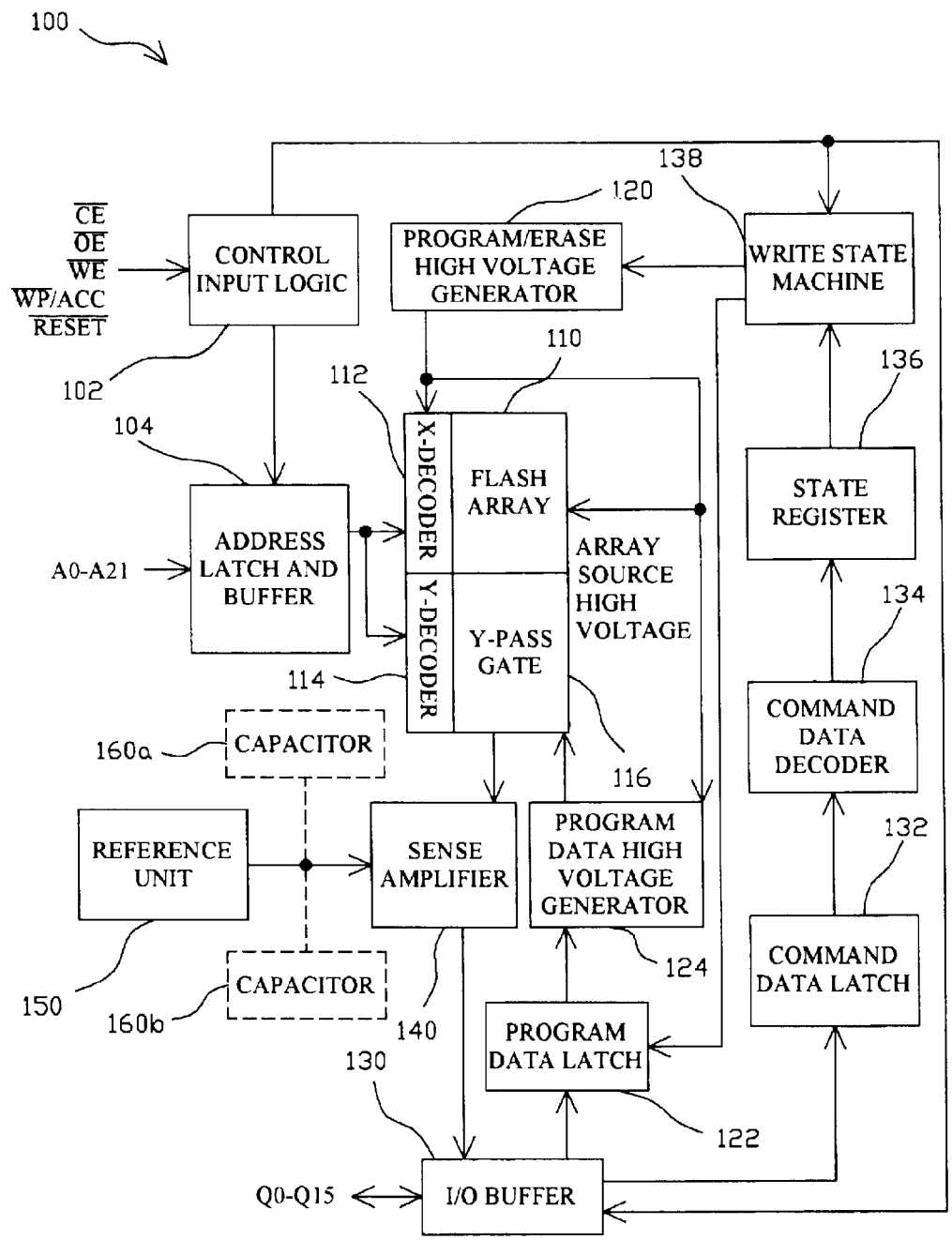
FIG. 1 is a block diagram of a flash memory system.

As shown in FIG. 1, a flash memory system 100 comprises a core circuit and peripheral to support the core circuit, of which the core circuit includes a flash array 110 consisted of a plurality of memory cells arranged in rows and columns for data storage. Each memory cell may store one or more bits of data, which is determined by the logic value of an electrical signal read out from the memory cell. X-decoder 112 and Y-decoder 114 are used to select a specific memory cell from the flash array 110 and access the data stored thereof through a Y-pass gate 116. For the operations of selecting memory cells and accessing data thereto, a control input logic 102 analyzes control signals, such as $\overline{CE}$, $\overline{QE}$, $\overline{WE}$, $\overline{WP}$/ACC and $\overline{RESET}$, and generates control signals for address latch and buffer 104, write state machine (WSM) 138, and 110 buffer 130. The address latch and buffer 104 is controlled to retrieve a specific address from address signals $A_0$–$A_{21}$ and then to send the address to the X-decoder 112 and Y-decoder 114 for addressing a memory cell in the flash array 110. During programming or erasing, the control input logic 102 generates various signals to control the write state machine 138 and I/O buffer 130, by which the I/O buffer 130 retrieves commands from data bus $Q_0$–$Q_{15}$ and generates command data to the write state machine 138 through command data latch 132, command data decoder 134, and state register 136, and accordingly a program/erase high voltage generator 120 generates high voltages to the source of the selected memory cell transistor in the flash array 110 and signals for the X-decoder 112 and a program data high voltage generator 124. The write state machine 138 controls a program data latch 122 to provide for the program data high voltage generator 124 the program data retrieved from bus signals $Q_0$–$Q_{15}$ by the I/O buffer 130 to generate high voltages for the core circuit. During a read-out operation of the flash array 110, a memory cell selected by the address signals $A_0$–$A_{21}$ outputs a signal representative of stored data to a sense amplifier 140 through the Y-pass gate 116 to determine the logic value of the stored data by comparing the signal from the memory cell with a reference signal generated by a reference unit 150 and then to send the determined data to the I/O buffer 130. The aforementioned programming operation includes a verify procedure after writing data into a memory cell that is similar to the read-out operation to verify the content of the programmed memory cell by the sense amplifier 140 to determine the logic content of the memory cell to ensure a correct programming is performed. Apparently, the sense amplifier 140 relies on a suitable reference signal provided by the reference unit 150 to determine a correct content for the selected memory cell. Unfortunately, parasite elements always exist in a real circuit, especially in a high-density memory array which has many bit lines crowded in an integrated circuit for connections of memory cells and thus inducing a capacitance effective to the operations of the memory circuit. Capacitors 160a and 160b are shown in FIG. 1 to represent the equivalent capacitance seen from the interconnection of the sense amplifier 140 to the reference unit 150. Within different memories of various density or capacity, the capacitors 160a and 160b differ in their capacitances and, hence, affect the operations of the sense amplifier 140.

Figure 2:
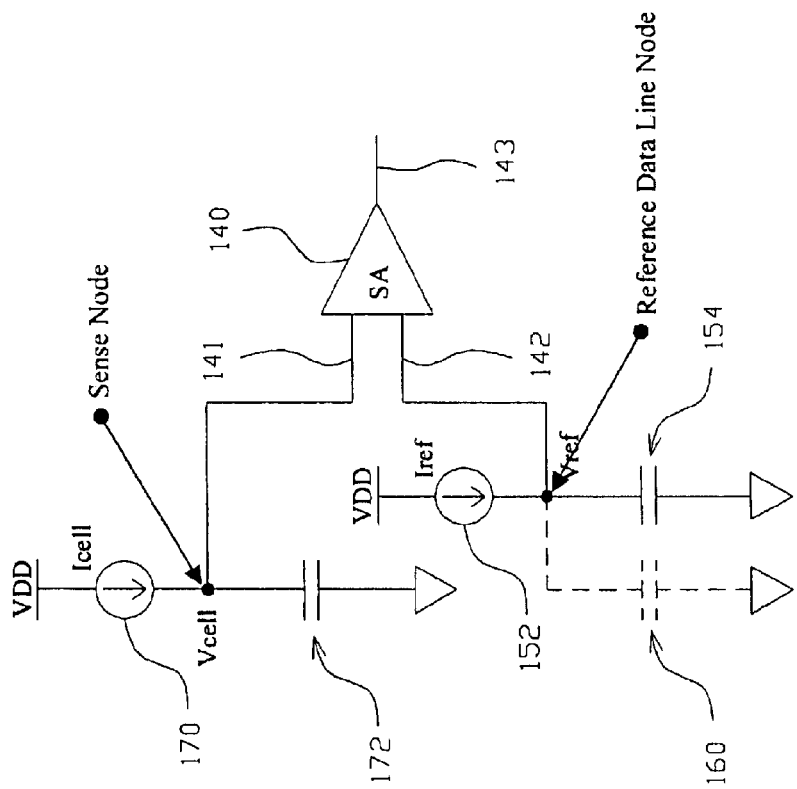
FIG. 2 is a simplified sense amplifier to determine the data stored in a memory cell.
Figure 3:
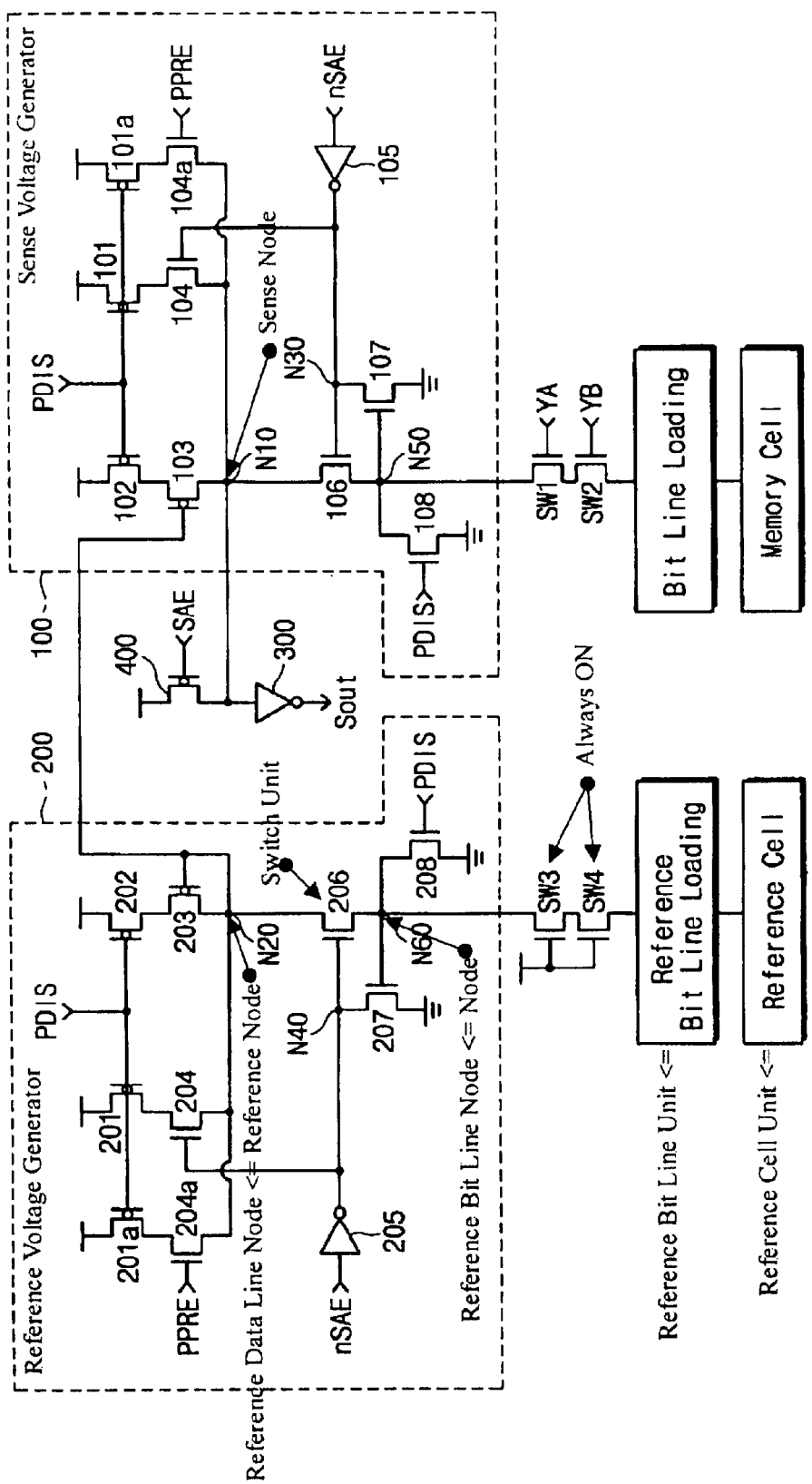
FIG. 3 shows an operation principle of a sense amplifier during a sensing procedure.

FIG. 2 is a simplified sense circuit to illustrate the operational principle of the sense amplifier 140 to determine the content stored in a memory cell, by which two inputs 141 and 142 of the sense amplifier 140 are coupled to a sense node $V_{cell}$ and a reference data line node $V_{ref}$, respectively, and the selected memory cell functions as a current source 170 with a memory cell current $I_{cell}$ to charge the load capacitor 172 on the sense node $V_{cell}$. Likewise, a reference cell works as a current source 152 with the reference current $I_{ref}$ to charges the load capacitor 154 on the reference data line node $V_{ref}$. In a predetermined timing, the sense amplifier 140 compares the voltages $V_{cell}$ and $V_{ref}$ respectively on the sense node and reference data line node to determine a sensing signal on its output 143. According to basic circuit theory, a capacitor is charged to a voltage $$V = Q/C \hspace{3cm} \text{(EQ-1)}$$
$$= (It)/C$$
$$= (I/C)t,$$

where Q is the electrical charges on the capacitor, C is the capacitance of the capacitor, I is the charging current, and t is the charging time. As indicated, the voltage (V) on the charged capacitor increases linearly as the charging time (t) passes with a slope that is the ratio of the charging current to the capacitance (I/C). FIG. 3 shows various curves in relation of voltage verses time, of which curve 156 represents the voltage change on the reference data line node $V_{ref}$ with the reference current $I_{ref}$ starting to charge the reference load capacitor 154 at time $T_1$ and terminated at time $T_3$, and curves 174 and 176 represent voltage changes of the load capacitor 172 on the sense node $V_{cell}$ by two memory cells programmed with "1" and "0", respectively. Curve 156 is so designed to lie in between the curves 174 and 176. The voltages $V_{cell}$ and $V_{ref}$ are compared during the period of time $T_2$ to $T_3$ to determine a "1" or "0" is programmed in the memory cell. If the load capacitance on the reference data line node $V_{ref}$ changes, so does the slope of the voltage $V_{ref}$, according to (EQ-1). An example is shown by curve 158 for such capacitance variations. Referring to FIG. 2, when the sense amplifier 140 is applied to memories of different density or capacity, the parasitic capacitance 160 connected to the reference data line node $V_{ref}$ varies and, as a result, the slope of the reference signal $V_{ref}$ alters. Consequently, the ratio of sensed voltage changes, resulting in that the voltage sense must be adjusted to maintain a better performance of the sense circuit.

Figure 4:
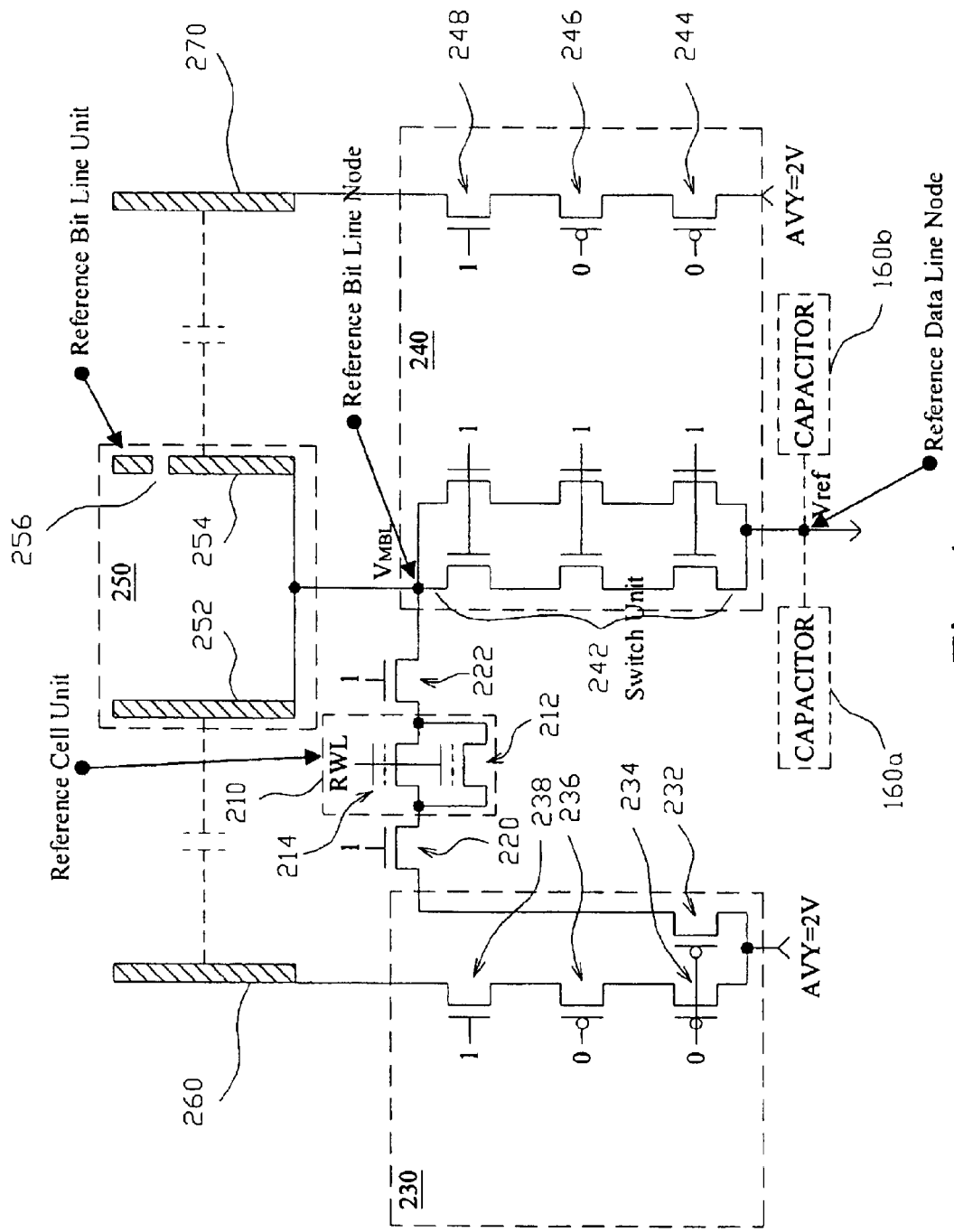
FIG. 4 is a preferred embodiment circuit for tuning the reference bit line loading according to the present invention.

FIG. 4 is a preferred embodiment of the present invention, of which a reference cell unit 210 includes two reference cells 212 and 214 connected in parallel and controlled by a gate signal RWL, each of them is capable of generating a reference bit line current when turned on and thus the reference cell unit 210 will provide double reference bit line current. Under the control of MOS transistors 220 and 222, the reference cell unit 210 can be connected to Y-pass gates 230 and 240 at opposite sides, respectively. Within the Y-pass gate 230, MOS transistor 232 is controlled to connect a drain side power source AVY to the MOS transistor 220, and MOS transistors 234, 236 and 238 are controlled to connect the power source AVY to a bit line 260 of the flash array 110. Within the Y-pass gate 240, a switch unit 242 connected in series is controlled to connect a reference bit line node $V_{MBL}$ to the reference data line node $V_{ref}$ that is connected to the sense amplifier 140. The Y-pass gate 240 also includes MOS transistors 244, 246, and 248 under controlled to connect the power source AVY to a bit line 270 of the flash array 110. A reference bit line unit 250 is connected to the reference bit line node $V_{MBL}$, which includes two reference metal bit lines (MBL's) 252 and 254 both connected to the reference bit line node $V_{MBL}$ with one of them, the reference metal bit line 254, being optionally cut off a portion shown by fracture 256. Before the reference metal bit line 254 is cut, the reference metal bit lines 254 and 252 have the same capacitance and are made by the same process and structure to manufacture the memory cell bit lines 260 and 270 for similating the reference metal bit lines 254 and 252 to the memory cell bit lines 260 and 270. The reference bit line unit 250 produces an equivalent capacitance $C_{MBL}$ connected to the reference bit line node $V_{MBL}$ whose value depends on the position of the fracture 256 or the remaining length of the cut reference metal bit line 254. In other words, the capacitance $C_{MBL}$ may be finely tuned by optionally selecting the remaining length of the cut reference metal bit line 254. During the read-out operation, both MOS transistors 232 and 220 are turned on to connect the power source AVY to the reference cell unit 210, and the MOS transistor 222 is also turned on to charge the reference bit line node $V_{MBL}$ by the reference current $I_{ref}$ generated by the reference cell unit 210. This embodiment is designed to include two flash reference cells 212 and 214 connected in parallel in the reference cell unit 210 and two reference metal bit lines 252 and 254 in the reference bit line unit 250 for simplified illustration. In a general application, the reference cell unit 210 includes N flash reference cells and the reference bit line unit 250 includes N reference bit lines. Each reference cell generates a reference bit current $I_1$, and thus the total reference current is $$I_{ref} = N \times I_1 \hspace{3cm} \text{(EQ-2).}$$

Likewise, each reference bit line has a capacitance $C_1$ and thus the overall capacitance of the reference bit line unit 250 is $$C_{MBL} = N \times C_1 \qquad (EQ-3)$$

to maintain the ratio of the reference current $I_{ref}$ to the reference bit line loading $C_{MBL}$ at $$I_{ref}/C_{MBL} = (N \times I_1)/(N \times C_1) \qquad (EQ-4)$$
$$= I_1/C_1.$$

As previously mentioned, the reference data line node $V_{ref}$ is connected with the parasitic capacitors 160*a* and 160*b*. When the switch unit 242 is turned on to connect the reference bit line node $V_{MBL}$ to the reference data line node $V_{ref}$, the equivalent capacitance seen from the sense amplifier 140 towards the reference side is the reference metal bit line loading $C_{MBL}$ connected with the parasitic capacitance 160*a* and 160*b* in parallel, and the parasitic capacitance 160*a* and 160*b* varies in memories of different density and capacity. However, the desired reference voltage $V_{ref}$ can be preciously defined by optionally cutting the reference bit line 254 to leave a suitable effective length. As a result, when applying the invented circuit to any memories of different density, it is to avoid the adjustment of the whole sense circuit one by one.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for tuning a reference bit line loading to a sense amplifier that compares a first voltage on a sense node which is selectively connected to a memory cell and which is representative of data stored in said memory cell with a second voltage on a reference data line node to determine a sensing signal on an output of said sense amplifier, said circuit comprising:

a reference cell unit for providing a reference current to a reference bit line node;

a switch unit for connecting said reference bit line node to said reference data line node; and a reference bit line unit connected to said reference bit line node, said reference bit line unit including at least one reference bit line that is selectively cut to determine said reference bit line loading.

2. A circuit according to claim 1, wherein said reference bit line comprises a metal.

3. A circuit according to claim 1, wherein said reference current and reference bit line loading have substantially a predetermined ratio.

4. A circuit according to claim 1, further comprising a parasitic capacitor connected to said reference data line node.

5. A circuit according to claim 1, further comprising a second switch unit for connecting a power source to said reference cell unit.

6. A circuit according to claim 1, wherein said reference cell unit comprises N reference cells connected in parallel, where N is a natural number.

7. A circuit according to claim 6, wherein each of said reference cells generates a reference bit current that is substantially 1/N of said reference current in magnitude.

8. A circuit according to claim 6, wherein said reference bit line unit comprises N reference bit lines.

9. A circuit according to claim 8, wherein said reference bit lines have capacitances that are substantially the same before the selective cutting.

10. A method for tuning a reference bit line loading to a sense amplifier that compares a first voltage on a sense node which is selectively connected to a memory cell and which is representative of data stored in said memory cell with a second voltage on a reference data line node to determine a sensing signal on an output of said sense amplifier, said method comprising the steps of:

connecting a reference bit line unit to a reference bit line node;

selectively cutting at least one reference bit line of said reference bit line unit for determining said reference bit line loading;

conveying a reference current to said reference bit line node; and connecting said reference bit line node to said reference data line node.

11. A method according to claim 10, further comprising setting said reference current and reference bit line loading to have a predetermined ratio.

12. A method according to claim 10, further comprising connecting a parasitic capacitor to said reference data line node.

13. A method according to claim 10, further comprising turning on a switch for connecting said reference bit line node to said reference data line node.

14. A method according to claim 10, further comprising connecting N reference cells in parallel for generating said reference current.

15. A method according to claim 14, wherein each of said reference cells generates a reference bit line current that is substantially 1/N of said reference current in magnitude.

16. A method according to claim 14, further comprising turning on a switch for connecting a power source to said N reference cells.

17. A method according to claim 14, further comprising connecting N reference bit lines in parallel for forming said reference bit line unit.

18. A method according to claim 17, further comprising setting each of said N reference bit lines substantially to a common capacitance valve before the selective cutting.

19. A circuit for controlling a reference signal that is supplied to a sense amplifier in a memory vie a reference data line node, comprising:

a reference cell unit for providing a reference current to a reference bit line node;

a switch for connecting the reference bit line node to the reference data line node; and a reference bit line unit that includes first and second reference bit lines with approximately the same length, the second reference bit line having a first portion and a second portion that is separated from the first portion by a gap, the first reference bit line and the second portion of the second reference bit line being connected to the reference bit line node.

20. A circuit according to claim 19, wherein the reference cell unit comprises a plurality of transistors that are connected parallel to one another.

* * * * *